(12) United States Patent
Yamamoto

(10) Patent No.: US 6,904,271 B2
(45) Date of Patent: Jun. 7, 2005

(54) HIGH-FREQUENCY-SIGNAL SWITCHING CIRCUIT SUPPRESSING HIGH-FREQUENCY-SIGNAL DISTORTION

(75) Inventor: Masaki Yamamoto, Fukushima-ken (JP)

(73) Assignee: Alps Electric Co., Ltd., Tokyo (JP)

(*) Notice: Subject to any disclaimer, the term of this patent is extended or adjusted under 35 U.S.C. 154(b) by 660 days.

(21) Appl. No.: 10/080,734

(22) Filed: Feb. 22, 2002

(65) Prior Publication Data

US 2002/0158681 A1 Oct. 31, 2002

(30) Foreign Application Priority Data

Feb. 28, 2001 (JP) .................................. 2001-054887

(51) Int. Cl.[7] .............................................. H04B 1/18
(52) U.S. Cl. ............................ 455/180.4; 455/180.2; 455/180.3; 348/725; 348/731
(58) Field of Search .......................... 455/180.2, 180.3, 455/180.4; 348/725, 731

(56) References Cited

U.S. PATENT DOCUMENTS 4,247,953 A * 1/1981 Shinagawa et al. ...... 455/191.2
6,226,503 B1 * 5/2001 Yamamoto et al. ...... 455/180.4

FOREIGN PATENT DOCUMENTS

| EP | 0 874 452 | 10/1998 |
| EP | 0 998 032 | 5/2000 |
| JP | 2001-217602 | 8/2001 |
| JP | 2001-274602 | 10/2001 |

* cited by examiner

Primary Examiner—William J. Deane, Jr.
Assistant Examiner—Quynh H. Nguyen
(74) Attorney, Agent, or Firm—Brinks Hofer Gilson & Lione

(57) ABSTRACT

A high-frequency-signal switching circuit includes a first high-frequency-signal path which includes first and second diodes connected in series with a high-frequency amplifier stage therebetween, and a second high-frequency-signal path formed of a third diode connected in parallel to the first high-frequency-signal path. A switching-voltage supply section switches the high-frequency amplifier stage and first and second diodes ON, and the third diode OFF, so that a high-frequency signal is transferred through the first high-frequency-signal path, or switches the high-frequency amplifier stage and first and second diodes OFF and the third diode ON, so that a high-frequency signal is transferred through the second high-frequency-signal path.

32 Claims, 3 Drawing Sheets

HIGH-FREQUENCY-SIGNAL SWITCHING CIRCUIT SUPPRESSING HIGH-FREQUENCY-SIGNAL DISTORTION

BACKGROUND OF THE INVENTION

1. Field of the Invention

The present invention relates to high-frequency-signal switching circuits, and more particularly, to a high-frequency-signal switching circuit which is connected to the input end of a TV-set tuner, which can be switched between when a strong electric field is input and when a weak electric field is input, and which has a reduced high-frequency-signal transfer loss and a reduced number of necessary components.

2. Description of the Related Art

There has been known a high-frequency-signal switching circuit connected to the input end of a TV-set tuner in order to handle both a strong-electric-field state and a weak-electric-field state. The high-frequency-signal switching circuit has a first high-frequency-signal path in which a high-frequency signal is transferred through a high-frequency amplifier stage, and a second high-frequency-signal path in which a high-frequency signal bypasses the high-frequency amplifier stage. In a weak-electric field state, a high-frequency signal is transferred through the first high-frequency-signal path, and is amplified by the high-frequency amplifier stage such that the high-frequency signal has a predetermined level when input to the TV-set tuner. In a strong-electric field state, a high-frequency signal is transferred through the second high-frequency-signal path so as to bypass the high-frequency amplifier stage, so that the high-frequency signal does not exceed the predetermined level when input to the TV-set tuner.

FIG. 3 is a circuit diagram of a conventional high-frequency-signal switching circuit. A tuner in a TV set is also shown in the figure.

As shown in FIG. 3, the high-frequency-signal switching circuit 30 is formed of a first high-frequency-signal path 31, a second high-frequency-signal path 32, an input coupling circuit 33, a high-frequency-signal input terminal 34, a high-frequency-signal output terminal 35, a band decoder (switching-voltage supply section) 36, and a power-supply terminal 37.

The first high-frequency-signal path 31 is formed of an amplification field-effect transistor (FET) $31_1$, a first diode $31_2$, a second diode $31_3$, bias-voltage setting resistors $31_4$ and $31_5$, a source resistor $31_6$, a bypass capacitor $31_7$, a load inductor $31_8$, a load resistor $31_9$, bypass capacitors $31_{10}$ and $31_{13}$, DC-blocking capacitors $31_{11}$ and $31_{16}$, and bias-voltage setting resistors $31_{12}$, $31_{14}$, and $31_{15}$. The second high-frequency-signal path 32 is formed of a signal-transfer field-effect transistor (FET) $32_1$, a third diode $32_2$, DC blocking capacitors $32_3$ and $32_6$, and bias-voltage setting resistors $32_4$ and $32_5$. The input coupling circuit 33 is formed of inductors $33_1$ and $33_3$, and capacitors $33_2$, $33_4$, and $33_5$.

In the first high-frequency-signal path 31, the gate of the amplification field-effect transistor $31_1$ is connected to the anode of the first diode $31_2$ and to one end of the bias-voltage setting resistor $31_5$, the source thereof is connected to one end of the source resistor $31_6$ and to one end of the bypass capacitor $31_7$, and the drain thereof is connected to one end of the load inductor $31_8$ and to one end of the DC-blocking capacitor $31_{11}$. The cathode of the first diode $31_2$ is connected to one end of the bias-voltage setting resistor $31_4$ and to one end of the capacitor $33_5$ in the input coupling circuit 33. The anode of the second diode $31_3$ is connected to one end of the bias-voltage setting resistor $31_{14}$, and the cathode thereof is connected to one end of the bias-voltage setting resistor $31_{15}$ and to one end of the DC-blocking capacitor $31_{16}$. The other end of the bias-voltage setting resistor $31_4$ is grounded, and the other end of the bias-voltage setting resistor $31_5$ is connected to an output end of the band decoder 36. The other end of the source resistor $31_6$ and the other end of the bypass capacitor $31_7$ are grounded. The other end of the load inductor $31_8$ is connected to one end of the load resistor $31_9$. The other end of the load resistor $31_9$ is connected to one end of the bypass capacitor $31_{10}$ and to the power-supply terminal 37. The other end of the bypass capacitor $31_{10}$ is grounded, and the other end of the DC-blocking capacitor $31_{11}$ is connected to the other end of the bias-voltage setting resistor $31_{12}$ and to the other end of the bias-voltage setting resistor $31_{14}$. The other end of the bias-voltage setting resistor $31_{12}$ is connected to one end of the bypass capacitor $31_{13}$ and to the output end of the band decoder 36. The other end of the bypass capacitor $31_{13}$ is grounded, and the other end of the bias-voltage setting resistor $31_{15}$ is grounded. The other end of the DC-blocking capacitor $31_{16}$ is connected to the high-frequency-signal output terminal 35.

In the second high-frequency-signal path 32, the gate of the signal-transfer field-effect transistor $32_1$ is connected to the anode of the third diode $32_2$ and to one end of the bias-voltage setting resistor $32_4$, the source thereof is connected to one end of the bias-voltage setting resistor $32_5$ and to one end of the DC-blocking capacitor $32_6$, and the drain thereof is connected to one end of the DC-blocking capacitor $32_3$. The cathode of the third diode $32_2$ is grounded, and the other end of the DC-blocking capacitor $32_3$ is connected to the cathode of the first diode $31_2$. The other end of the bias-voltage setting resistor $32_4$ and the other end of the bias-voltage setting resistor $32_5$ are connected to the output end of the band decoder 36. The other end of the DC-blocking capacitor $32_6$ is connected to the cathode of the second diode $31_3$. In the input coupling circuit 33, one end of the inductor $33_1$ is connected to one end of the capacitor $33_2$ and to the high-frequency-signal input terminal 34, and the other end thereof is grounded. The other end of the capacitor $33_2$ is connected to one end of the inductor $33_3$ and to the other end of the capacitor $33_5$, the other end of the inductor $33_3$ is connected to one end of the capacitor $33_4$, and the other end of the capacitor $33_4$ is grounded. The input end of the band decoder 36 is connected to the power-supply terminal 37, and the power-supply terminal 37 is connected to a power-supply terminal 47 of a TV-set tuner 40.

As shown in FIG. 3, the TV-set tuner 40 is formed of a VHF antenna circuit section (VHFANT) 41v, a UHF antenna circuit section (UHFANT) 41u, a VHF high-frequency amplifier section (VHFRFAMP) 42v, a UHF high-frequency amplifier section (UHFRFAMP) 42u, a VHF high-frequency circuit section (VHFRF) 43v, a UHF high-frequency circuit section (UHFRF) 43u, a VHF mixing stage (VHFMIX) 44v, a UHF mixing section (UHFMIX) 44u, an intermediate-frequency amplifier section (IFAMP) 45, an intermediate-frequency-signal output terminal 46, and the power-supply terminal 47.

In this case, the input end of the VHF antenna circuit section 41v is connected to the high-frequency-signal output terminal 35 of the high-frequency-signal switching circuit 30, and the output end thereof is connected to the input end of the VHF high-frequency amplifier section 42v. The input end of the UHF antenna circuit section 41u is connected to the high-frequency-signal output terminal 35, and the output end thereof is connected to the input end of the UHF high-frequency amplifier section 42u. The output end of the VHF high-frequency amplifier section 42v is connected to the input end of the VHF high-frequency circuit section 43v, and the output end of the UHF high-frequency amplifier section 42u is connected to the input end of the UHF high-frequency circuit section 43u. The output end of the VHF high-frequency circuit section 43v is connected to the input end of the VHF mixing stage 44v, and the output end of the UHF high-frequency circuit section 43u is connected to the input end of the UHF mixing stage 44u. The output end of the VHF mixing stage 44v is connected to the input end of the intermediate-frequency amplifier section 45, and the output end of the UHF mixing stage 44u is connected to the input end of the intermediate-frequency amplifier section 45. The out put end of the intermediate-frequency amplifier section 45 is connected to the intermediate-frequency-signal output terminal 46.

The high-frequency-signal switching circuit 30 having the above structure operates in the following way.

When the TV-set tuner 40 connected to the high-frequency-signal switching circuit 30 is used in a weak-electric-field area, namely, an area where the field intensity of received signals is low, the band decoder 36 in the high-frequency-signal switching circuit 30 is switched to output a voltage $V_B$, such as 5 V, equal to a power-supply voltage from its output end. Then, the voltage $V_B$ output from the band decoder 36 is sent to the gate of the amplification field-effect transistor $31_1$ through the bias-voltage setting resistor $31_5$ to make the amplification field-effect transistor $31_1$ be in an operation state. At the same time, current caused by the voltage $V_B$ flows through the bias-voltage setting resistor $31_5$, the first diode $31_2$, and the bias-voltage setting resistor $31_4$ into the ground to turn on the first diode $31_2$. Current caused by the voltage $V_B$ also flows through the bias-voltage setting resistors $31_{12}$ and $31_{14}$, the second diode $31_3$, and the bias-voltage setting resistor $31_{15}$ into the ground to turn on the second diode $31_3$. Current caused by the voltage $V_B$ also flows through the bias-voltage setting resistor $32_4$ and the third diode $32_2$ to make the gate voltage of the signal-transfer field-effect transistor $32_1$ lower than the source voltage thereof to turn off the signal-transfer field-effect transistor $32_1$.

Therefore, whereas the first high-frequency-signal path 31 is active, the second high-frequency-signal path 32 is inactive. A low-level high-frequency signal input to the high-frequency-signal input terminal 34 is sent through the first diode $31_2$, which is on, to the amplification field-effect transistor $31_1$, is amplified to a predetermined level by the amplification field-effect transistor $31_1$, and then, is sent through the second diode $31_3$, which is on, to the high-frequency-signal output terminal 35. At this point of time, since the signal-transfer field-effect transistor $32_1$ is off, the high-frequency signal is not sent through the signal-transfer field-effect transistor $32_1$ to the high-frequency-signal output terminal 35.

When the TV-set tuner 40 connected to the high-frequency-signal switching circuit 30 is used in a strong-electric-field area, namely, an area where the field intensity of received signals is high, the band decoder 36 in the high-frequency-signal switching circuit 30 is switched to output a voltage $V_E$, such as 0 V, equal to a ground voltage from its output end. Then, even when the ground voltage $V_E$ output from the band decoder 36 is sent to the gate of the amplification field-effect transistor $31_1$ through the bias-voltage setting resistor $31_5$, it cannot make the amplification field-effect transistor $31_1$ be in an operation state. The amplification field-effect transistor $31_1$ is in an non-operation state. At the same time, current does not flow through the bias-voltage setting resistor $31_5$, the first diode $31_2$, and the bias-voltage setting resistor $31_4$ into the ground, by the ground voltage $V_E$, so that the first diode $31_2$ is turned off. In the same way, current does not flow through the bias-voltage setting resistors $31_{12}$ and $31_{14}$, the second diode $31_3$, and the bias-voltage setting resistor $31_5$ into the ground, by the ground voltage $V_E$, so that the second diode $31_3$ is also turned off. Current does not flow through the bias-voltage setting resistors $32_4$ and the third diode $32_2$, by the ground voltage $V_E$, so that the voltage difference between the gate and the source of the signal-transfer field-effect transistor $32_1$ becomes zero to turn on the signal-transfer field-effect transistor $32_1$.

Therefore, whereas the first high-frequency-signal path 31 is inactive, the second high-frequency-signal path 32 is active. A high-level high-frequency signal input to the high-frequency-signal input terminal 34 is sent through the signal-transfer field-effect transistor $32_1$, which is on, to the high-frequency-signal output terminal 35. At this point of time, since the first diode $31_2$ and the second diode $31_3$ are both off, and the amplification field-effect transistor $31_1$ is inactive, the high-frequency signal is not sent through the amplification field-effect transistor $31_1$ to the high-frequency-signal output terminal 35.

Then, the high-frequency signal sent to the high-frequency-signal output terminal 35 is sent to the TV-set tuner. If the high-frequency signal is a received VHF-band TV signal, signal components in unnecessary signal-frequency bands are removed from the received TV signal by the VHF antenna circuit section 41v, the resultant signal is amplified to a predetermined level by the VHF high-frequency amplifier section 42v, signal components in unnecessary signal-frequency bands are again removed from the amplified signal by the VHF high-frequency circuit section 43v, the resultant signal is converted to an intermediate-frequency signal by the VHF mixing stage 44v, the obtained intermediate-frequency signal is amplified to a predetermined level by the intermediate-frequency amplifier section 45, and the amplified signal is sent to the intermediate-frequency-signal output terminal 46. If the high-frequency signal is a received UHF-band TV signal, signal components in unnecessary signal-frequency bands are removed from the received TV signal by the UHF antenna circuit section 41u, the resultant signal is amplified to a predetermined level by the UHF high-frequency amplifier section 42u, signal components in unnecessary signal-frequency bands are again removed from the amplified signal by the UHF high-frequency circuit section 43u, the resultant signal is converted to an intermediate-frequency signal by the UHF mixing stage 44u, the obtained intermediate-frequency signal is amplified to a predetermined level by the intermediate-frequency amplifier section 45, and the amplified signal is sent to the intermediate-frequency-signal output terminal 46.

In the known high-frequency-signal switching circuit 30, when the first high-frequency-signal path 31 becomes inactive and at the same time, the second high-frequency-signal path 32 becomes active, a high-frequency signal is transferred in the second high-frequency-signal path 32 through the signal-transfer field-effect transistor $32_1$, which is on. Therefore, a signal transfer loss, for example, of about 3 dB to 4 dB occurs due to the signal-transfer field-effect transistor $32_1$. In addition, since relatively expensive circuit components, such as the high-frequency field-effect transistor $32_1$, are required to make the second high-frequency-signal path 32, the manufacturing cost of the high-frequency-signal switching circuit 30 becomes high.

In the known high-frequency-signal switching circuit 30, when the first high-frequency-signal path 31 is inactive, an off bias voltage which makes the first diode $31_2$ and the second diode $31_3$ off is relatively shallow. Therefore, when a high-level high-frequency signal is sent, a part of the high-level high-frequency signal flows into the first diode $31_2$ and the second diode $31_3$, the high-frequency signal which is transferred through the second high-frequency-signal path 32 may be distorted.

SUMMARY OF THE INVENTION

The present invention has been made in consideration of such a technical background. Accordingly, it is an object of the present invention to provide a high-frequency-signal switching circuit which reduces a signal transfer loss in a weak-electric-field state and relatively expensive circuit components and which makes the off bias value of a diode deep to suppress a distortion in a high-frequency signal.

The foregoing object is achieved by the present invention through the provision of a high-frequency-signal switching circuit including: a first high-frequency-signal path including a high-frequency amplifier stage, a first diode connected in series between a high-frequency-signal input end and the input end of the high-frequency amplifier stage, and a second diode connected in series between a high-frequency-signal output end and the output end of the high-frequency amplifier stage; a second high-frequency-signal path comprising a third diode connected in series between the high-frequency-signal input end and the high-frequency-signal output end; and a switching-voltage supply section for switching the high-frequency amplifier stage between an operation state and an non-operation state, and for switching the first to third diodes between an ON state and an OFF state, wherein, when the switching voltage of the switching-voltage supply section has a first value, the high-frequency amplifier stage is in the operation state, the first and second diodes are in the ON state, and the third diode is in the OFF state, so that a high-frequency signal is transferred through the first high-frequency-signal path, and when the switching voltage of the switching-voltage supply section has a second value, the high-frequency amplifier stage is in the non-operation state, the first and second diodes are in the OFF state, and the third diode is in the ON state, so that a high-frequency signal is transferred through the second high-frequency-signal path.

Since the second high-frequency-signal path is formed of the third diode, which is on or off, a signal transfer loss can be largely reduced when the third diode is on. In addition, only the third diode is used to constitute the second high-frequency-signal path, the number of components is reduced. Furthermore, since a reverse bias voltage which sufficiently turns off the first diode and the second diode in the first high-frequency-signal path is generated when a forward bias voltage which turns on the third diode is generated, it does not occur that a part of a high-level high-frequency signal flows into the first diode and the second diode when the diodes are off to distort the high-frequency signal being transferred.

The high-frequency-signal switching circuit may be configured such that the anode of each of the first and second diodes is connected to the switching-voltage supply section through a resistor, and the cathode thereof is connected to a reference potential point through a resistor. The high-frequency-signal switching circuit may be further configured such that the resistance of each resistor is specified such that, when the switching voltage has the first value, the cathode voltage of the first diode is lower than that of the second diode, and when the switching voltage has the second value, the cathode voltage of the first diode is higher than that of the second diode.

With such a configuration, it is easy to specify a forward bias voltage which turns on the first diode and the second diode, and a reverse bias voltage which turns off the first diode and the second diode. In addition, it is also easy to specify a reverse bias voltage which turns off the third diode, and a forward bias voltage which turns on the third diode.

DESCRIPTION OF THE PREFERRED EMBODIMENT

Figure 1:
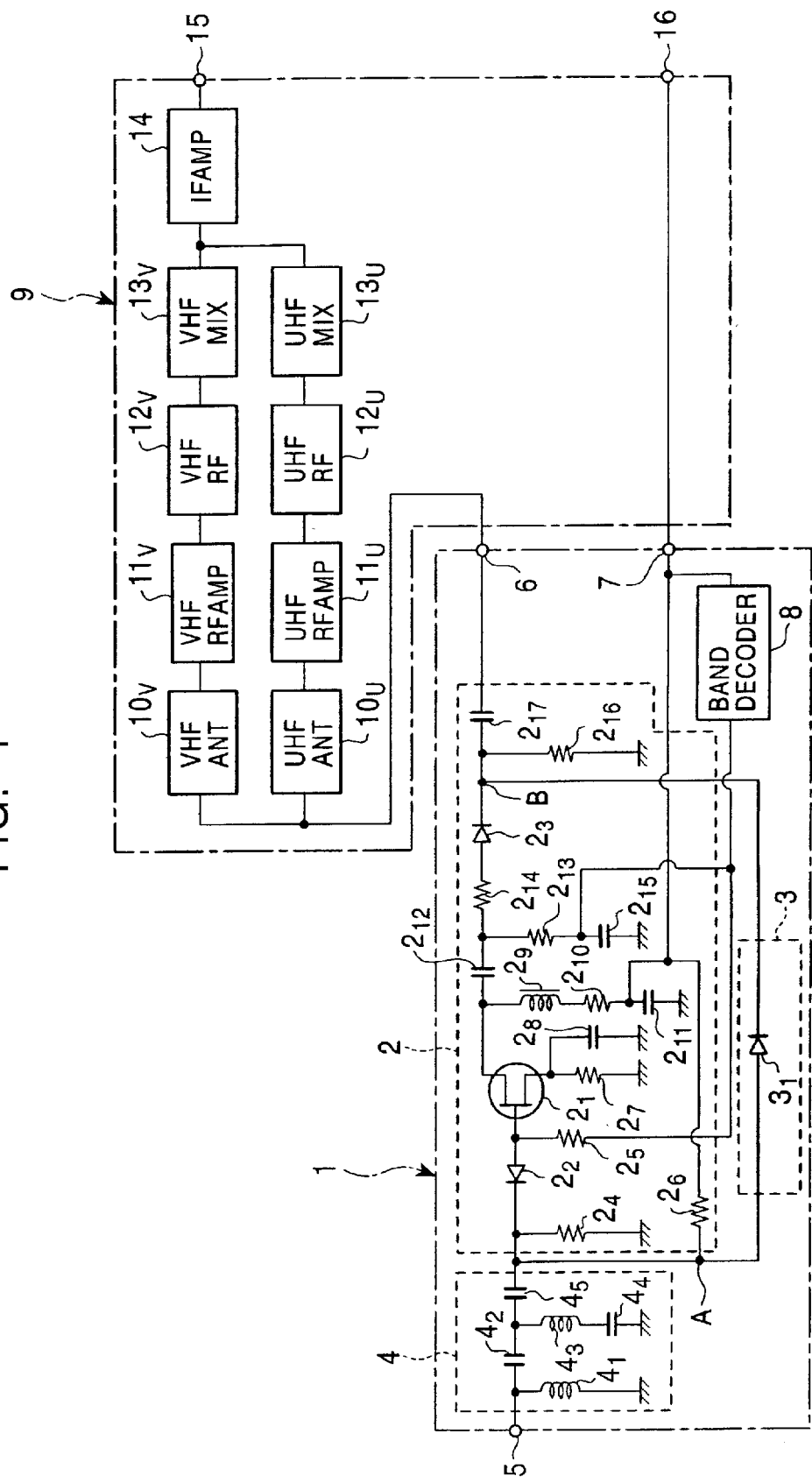
FIG. 1 is a circuit diagram of a high-frequency-signal switching circuit according to an embodiment of the present invention, with a TV-set tuner being shown together.

An embodiment of the present invention will be described below by referring to the drawings.

FIG. 1 is a circuit diagram of a high-frequency-signal switching circuit according to an embodiment of the present invention. A tuner in a TV set is also shown in the figure.

As shown in FIG. 1, the high-frequency-signal switching circuit 1 is formed of a first high-frequency-signal path 2, a second high-frequency-signal path 3, an input coupling circuit 4, a high-frequency-signal input terminal 5, a high-frequency-signal output terminal 6, a power-supply terminal 7, and a band decoder (switching-voltage supply section) 8.

The first high-frequency-signal path 2 is formed of an amplification field-effect transistor (FET) $2_1$, a first diode $2_2$, a second diode $2_3$, bias-voltage setting resistors $2_4$, $2_5$, and $2_6$, a source resistor $2_7$, a bypass capacitor $2_8$, a load inductor $2_9$, a load resistor $2_{10}$, bypass capacitors $2_{11}$ and $2_{15}$, a DC-blocking capacitors $2_{12}$ and $2_{17}$, and bias-voltage setting resistors $2_{13}$, $2_{14}$, and $2_{16}$. The second high-frequency-signal path 3 is formed of a third diode $3_1$. The input coupling circuit 4 is formed of inductors $4_1$ and $4_3$, and capacitors $4_2$, $4_4$, and $4_5$. In this case, a circuit which includes the amplification field-effect transistor $2_1$ constitutes a linear high-frequency amplifier stage.

In the first high-frequency-signal path 2, the gate of the amplification field-effect transistor $2_1$ is connected to the anode of the first diode $2_2$ and to one end of the bias-voltage setting resistor $2_5$, the source thereof is connected to one end of the source resistor $2_7$ and to one end of the bypass capacitor $2_8$, and the drain thereof is connected to one end of the load inductor $2_9$ and to one end of the DC-blocking capacitor $2_{12}$. The cathode of the first diode $2_2$ is connected to one end of the bias-voltage setting resistor $2_4$ and to one end of the capacitor $4_5$ in the input coupling circuit 4. The anode of the second diode $2_3$ is connected to one end of the bias-voltage setting resistor $2_{14}$, and the cathode thereof is connected to one end of the bias-voltage setting resistor $2_{16}$ and to one end of the DC-blocking capacitor $2_{17}$. The other end of the bias-voltage setting resistor $2_4$ is grounded, and the other end of the bias-voltage setting resistor $2_5$ is connected to an output end of the band decoder 8. The other end of the bias-voltage setting resistor $2_6$ is connected to the power-supply terminal 7. The other end of the source resistor $2_7$ and the other end of the bypass capacitor $2_8$ are grounded. The other end of the load inductor $2_9$ is connected to one end of the load resistor $2_{10}$. The other end of the load resistor $2_{10}$ is connected to one end of the bypass capacitor $2_{11}$ and to the power-supply terminal 7. The other end of the bypass capacitor $2_{11}$ is grounded, and the other end of the DC-blocking capacitor $2_{12}$ is connected to one end of the bias-voltage setting resistor $2_{13}$ and to the other end of the bias-voltage setting resistor $2_{14}$. The other end of the bias-voltage setting resistor $2_{13}$ is connected to one end of the bypass capacitor $2_{15}$ and to the output end of the band decoder 8. The other end of the bypass capacitor $2_{15}$ is grounded, and the other end of the bias-voltage setting resistor $2_{16}$ is grounded. The other end of the DC-blocking capacitor $2_{17}$ is connected to the high-frequency-signal output terminal 6.

In the second high-frequency-signal path 3, the anode of the third diode $3_1$ is connected to the cathode of the first diode $2_2$, and the cathode thereof is connected to the cathode of the second diode $2_3$. In the input coupling circuit 4, one end of the inductor $4_1$ is connected to one end of the capacitor $4_2$ and to the high-frequency-signal input terminal 5, and the other end thereof is grounded. The other end of the capacitor $4_2$ is connected to one end of the inductor $4_3$ and to the other end of the capacitor $4_5$, the other end of the inductor $4_3$ is connected to one end of the capacitor $4_4$, and the other end of the capacitor $4_4$ is grounded. The power-supply terminal 7 is connected to a power-supply terminal 16 of a TV-set tuner 9, and the input end of the band decoder 8 is connected to the power-supply terminal 7.

Figure 3:
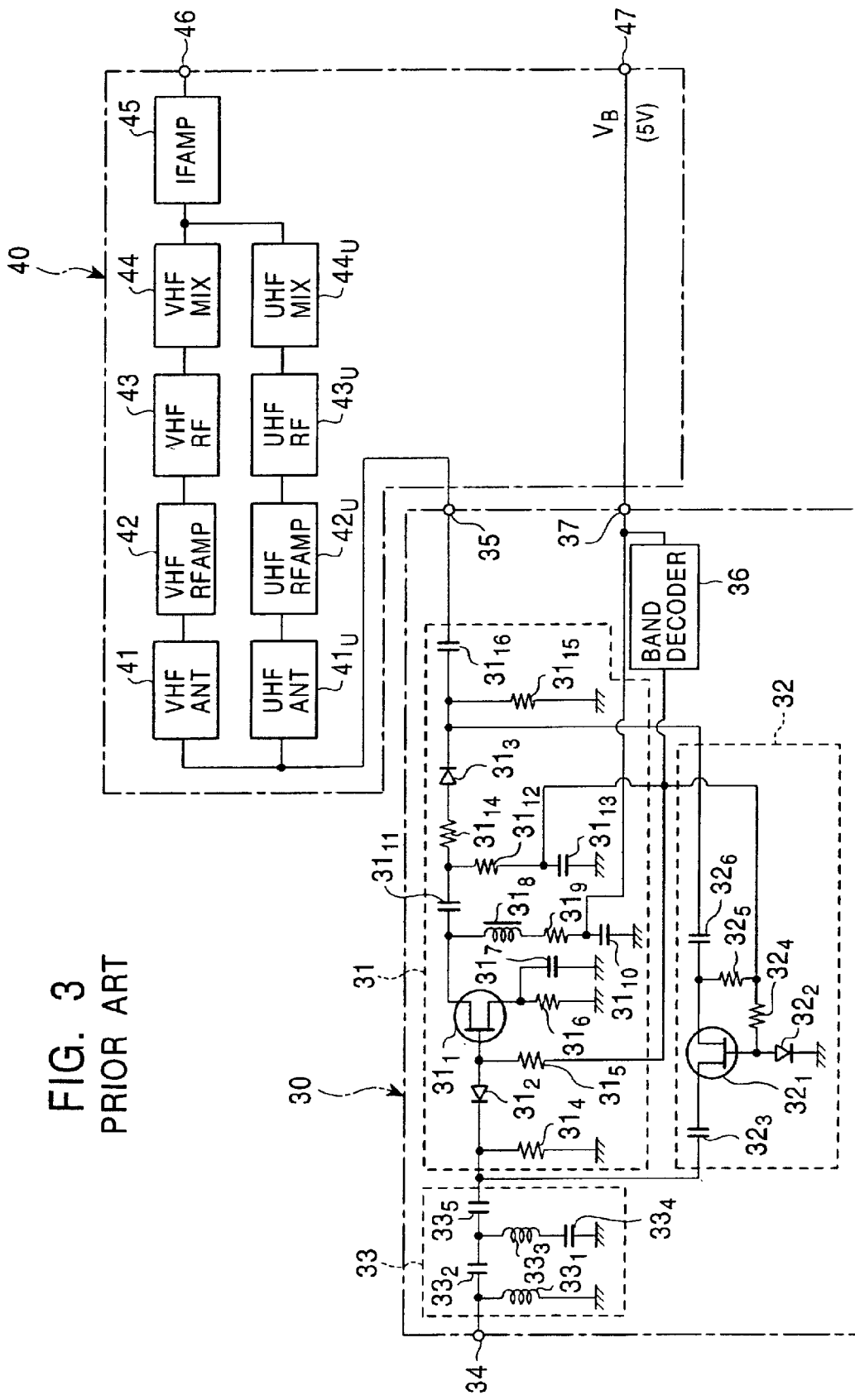
FIG. 3 is a circuit diagram of a known high-frequency-signal switching circuit with a TV-set tuner being shown together.

As shown in FIG. 1, the TV-set tuner 9 has the same structure as the TV-set tuner 40 shown in FIG. 3, and is formed of a VHF antenna circuit section (VHFANT) 10v, a UHF antenna circuit section (UHFANT) 10u, a VHF high-frequency amplifier section (VHFRFAMP) 11v, a UHF high-frequency amplifier section (UHFRFAMP) 11u, a VHF high-frequency circuit section (VHFRF) 12v, a UHF high-frequency circuit section (UHFRF) 12u, a VHF mixing stage (VHFMIX) 13v, a UHF mixing section (UHFMIX) 13u, an intermediate-frequency amplifier section (IFAMP) 14, an intermediate-frequency-signal output terminal 15, and the power-supply terminal 16.

In this case, the input end of the VHF antenna circuit section 10v is connected to the high-frequency-signal output terminal 6, and the output end thereof is connected to the input end of the VHF high-frequency amplifier section 11v. The input end of the UHF antenna circuit section 10u is connected to the high-frequency-signal output terminal 6, and the output end thereof is connected to the input end of the UHF high-frequency amplifier section 11u. The output end of the VHF high-frequency amplifier section 11v is connected to the input end of the VHF high-frequency circuit section 12v, and the output end of the UHF high-frequency amplifier section 11u is connected to the input end of the UHF high-frequency circuit section 12u. The output end of the VHF high-frequency circuit section 12v is connected to the input end of the VHF mixing stage 13v, and the output end of the UHF high-frequency circuit section 12u is connected to the input end of the UHF mixing stage 13u. The output end of the VHF mixing stage 13v is connected to the input end of the intermediate-frequency amplifier section 14, and the output end of the UHF mixing stage 13u is connected to the input end of the intermediate-frequency ampli-fier section 14. The output end of the intermediate-frequency amplifier section 14 is connected to the intermediate-frequency-signal output terminal 15.

Figure 2A:
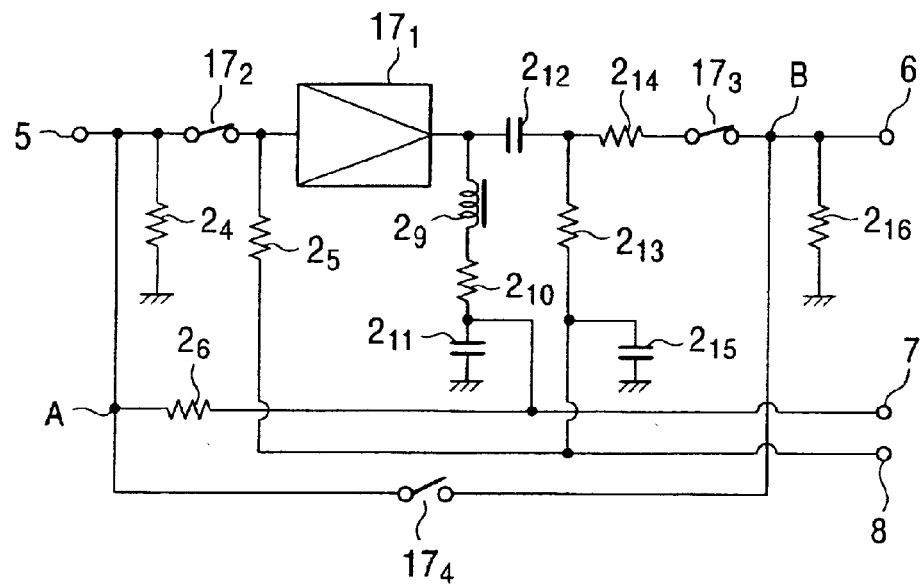
FIG. 2A and FIG. 2B are equivalent circuit diagrams showing a main part which is operating, of the high-frequency-signal switching circuit shown in FIG. 1.
Figure 2B:
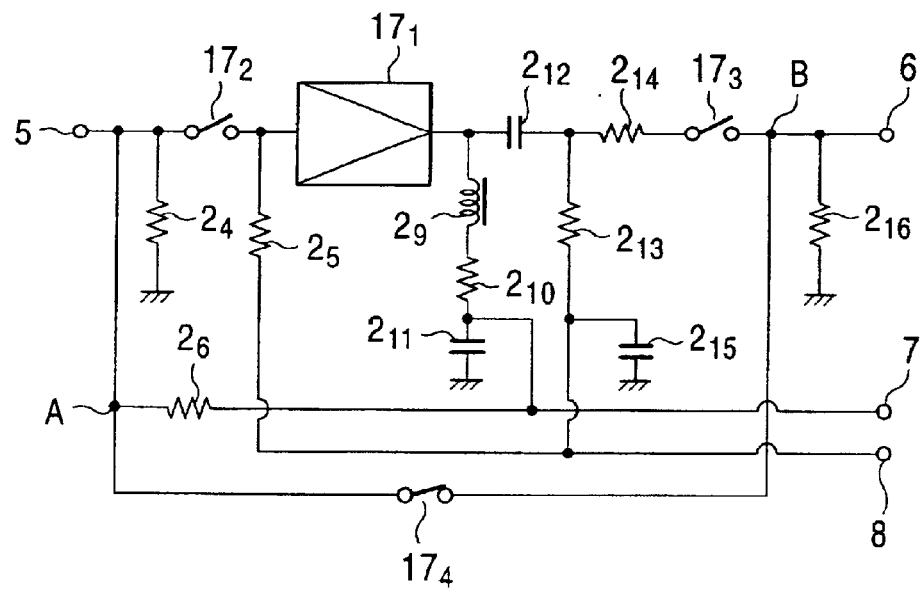

FIG. 2A and FIG. 2B are equivalent circuit diagrams of a main section which is operating, of the high-frequency-signal switching circuit 1 shown in FIG. 1. FIG. 2A shows a state in which the first high-frequency-signal path 2 is operating and the second high-frequency-signal path 3 is not operating. FIG. 2B shows a state in which the first high-frequency-signal path 2 is not operating and the second high-frequency-signal path 3 is operating.

In FIG. 2A and FIG. 2B, there are shown a high-frequency amplifier stage $17_1$ which includes the amplification field-effect transistor $2_1$, a first switch $17_2$ formed of the first diode $2_2$, a second switch $17_3$ formed of the second diode $2_3$, and a third switch $17_4$ formed of the third diode $3_1$. The same symbols as those used in FIG. 1 are assigned to the same components as those shown in FIG. 1.

The operation of the high-frequency-signal switching circuit 1 according to the present embodiment will be described below by referring to FIG. 2A and FIG. 2B.

Also in the present embodiment, when the TV-set tuner 9 connected to the high-frequency-signal switching circuit 1 is used in a weak-electric-field area, namely, an area where the field intensity of received signals is low, the band decoder 8 in the high-frequency-signal switching circuit 1 is switched to output a voltage $V_B$, such as 5 V, equal to a power-supply voltage from its output end. Then, the voltage $V_B$ output from the band decoder 8 is sent to the gate of the amplification field-effect transistor $2_1$ through the bias-voltage setting resistor $2_5$ to make the amplification field-effect transistor $2_1$ be in an operation state. At the same time, current caused by the voltage $V_B$ flows through the bias-voltage setting resistor $2_5$, the first diode $2_2$, and the bias-voltage setting resistor $2_4$ into the ground to turn on the first diode $2_2$. Current caused by the voltage $V_B$ also flows through the two bias-voltage setting resistor $2_{13}$ and $2_{14}$, the second diode $2_3$, and the bias-voltage setting resistor $2_{16}$ into the ground to turn on the second diode $2_3$. In this state, when the resistances of the bias-voltage setting resistors $2_4$, $2_5$, $2_{13}$, $2_{14}$, and $2_{16}$ are specified such that, if the power-supply voltage is 5 V, the anode voltage of the third diode $3_1$, namely, a voltage at a point A shown in FIG. 1, FIG. 2A, and FIG. 2B, is 2.5 V, and the cathode voltage of the third diode $3_1$, namely, a voltage at a point B shown in FIG. 1, FIG. 2A, and FIG. 2B, is 4.6 V, the voltage $V_B$ is applied to the third diode $3_1$ through the bias-voltage setting resistor $2_6$ as a reverse bias voltage to turn off the third diode $3_1$. The state of the high-frequency-signal switching circuit 1, obtained at this point of time is shown in FIG. 2A.

Therefore, whereas the first high-frequency-signal path 2 is active, the second high-frequency-signal path 3 is inactive. A low-level high-frequency signal input to the high-frequency-signal input terminal 5 is sent through the first diode $2_2$, which is on, to the amplification field-effect transistor $2_1$, which is in an operation state, is amplified to a predetermined level by the amplification field-effect transistor $2_1$, and then, is sent through the second diode $2_3$, which is on, to the high-frequency-signal output terminal 6. On the other hand, since the third diode $3_1$ is off, the high-frequency signal is not sent through the third diode $3_1$ to the high-frequency-signal output terminal 6.

When the TV-set tuner 9 connected to the high-frequency-signal switching circuit 1 is used in a strong-electric-field area, namely, an area where the field intensity of received signals is high, the band decoder 8 in the high-frequencysignal switching circuit 1 is switched to output a voltage $V_E$, such as 0 V, equal to a ground voltage from its output end. Then, even when the ground voltage $V_E$ output from the band decoder 8 is sent to the gate of the amplification field-effect transistor $2_1$ through the bias-voltage setting resistor $2_5$, it cannot make the amplification field-effect transistor $2_1$ be in an operation state. The amplification field-effect transistor $2_1$ is in an non-operation state. At the same time, current does not flow through the bias-voltage setting resistor $2_5$, the first diode $2_2$, and the bias-voltage setting resistor $2_4$ into the ground, by the ground voltage $V_E$, so that the first diode $2_2$ is turned off. In the same way, current does not flow through the two bias-voltage setting resistor $2_{13}$ and $2_{14}$, the second diode $2_3$, and the bias-voltage setting resistor $2_{16}$ into the ground, by the ground voltage $V_E$, so that the second diode $2_3$ is also turned off. In this state, a bias voltage is applied from the power-supply terminal 7 through the bias-voltage setting resistor $2_6$ to the cathode of the second diode $2_2$ and to the anode of the third diode 3, a voltage at the point A shown in FIG. 1, FIG. 2A, and FIG. 2B becomes 1.6 V, and the cathode voltage of the third diode $3_1$, namely, a voltage at the point B shown in FIG. 1, FIG. 2A, and FIG. 2B, becomes 0.9 V. A forward bias voltage is applied to the third diode $3_1$ to turn on the third diode $3_1$. Reverse bias voltages are positively applied to the first diode $2_2$ and to the second diode $2_3$ as the third diode $3_1$ is turned on, and the reverse bias voltage applied to the first diode $2_2$ is high. The state of the high-frequency-signal switching circuit 1, obtained at this point of time is shown in FIG. 2B.

Therefore, whereas the first high-frequency-signal path 2 is inactive, the second high-frequency-signal path 3 is active. A high-level high-frequency signal input to the high-frequency-signal input terminal 5 is sent through the third diode $3_1$, which is on, to the high-frequency-signal output terminal 6. At this point of time, since the first diode $2_2$ and the second diode $2_3$ are both off, and the amplification field-effect transistor $2_1$ is inactive, the high-frequency signal is not sent through the amplification field-effect transistor $2_1$ to the high-frequency-signal output terminal 6. In addition, since the reverse bias voltage applied to the first diode $2_2$ is relatively deep, the high-level high-frequency signal does not flow into the first diode $2_2$ or into the second diode $2_3$. Therefore, the high-frequency signal sent through the second high-frequency-signal path 3 is not distorted.

Then, the high-frequency signal sent through the high-frequency-signal switching circuit 1 is sent to the TV-set tuner 9 connected to the high-frequency-signal output terminal 6. Also in this case, if the high-frequency signal is a received VHF-band TV signal, signal components in unnecessary signal-frequency bands are removed from the received TV signal by the VHF antenna circuit section 10$v$, the resultant signal is amplified to a predetermined level by the VHF high-frequency amplifier section 11$v$, signal components in unnecessary signal-frequency bands are again removed from the amplified signal by the VHF high-frequency circuit section 12$v$, the resultant signal is converted to an intermediate-frequency signal by the VHF mixing stage 13$v$, the obtained intermediate-frequency signal is amplified to a predetermined level by the intermediate-frequency amplifier section 14, and the amplified signal is sent to the intermediate-frequency-signal output terminal 15. If the high-frequency signal is a received UHF-band TV signal, signal components in unnecessary signal-frequency bands are removed from the received TV signal by the UHF antenna circuit section 10$u$, the resultant signal is amplified to a predetermined level by the UHF high-frequency ampli-fier section 11$u$, signal components in unnecessary signal-frequency bands are again removed from the amplified signal by the UHF high-frequency circuit section 12$u$, the resultant signal is converted to an intermediate-frequency signal by the UHF mixing stage 13$u$, the obtained intermediate-frequency signal is amplified to a predetermined level by the intermediate-frequency amplifier section 14, and the amplified signal is sent to the intermediate-frequency-signal output terminal 15.

Although the voltage of each portion in the high-frequency-signal switching circuit 1 according to the present embodiment indicates an appropriate voltage used in reduction to practice, the high-frequency-signal switching circuit 1 according to the present invention is not limited to that having such voltages. It is needless to say that such voltages can be appropriately changed within the scope of the technical contents of the present invention.

Note that the diodes are not necessarily limited to semiconductor diodes: they may be any type of switch that is electronically controllable. In addition, the diodes may be of any type known in the art including p-n diodes, Schottky diodes or Josephson junctions, for example. Similarly, the amplifier may be any amplifier known in the art including bipolar junction transistors, for example.

What is claimed is:

1. A high-frequency-signal switching circuit comprising:
   a first high-frequency-signal path including:
      a high-frequency amplifier stage;
      a first diode connected in series between a high-frequency-signal input end and an input end of the high-frequency amplifier stage; and
      a second diode connected in series between a high-frequency-signal output end and an output end of the high-frequency amplifier stage;
   a second high-frequency-signal path including a third diode connected in series between the high-frequency-signal input end and the high-frequency-signal output end; and
   a switching-voltage supply section to switch the high-frequency amplifier stage between an operation state and an non-operation state, and to switch the first, second and third diodes between an ON state and an OFF state,
   wherein, when a switching voltage of the switching-voltage supply section has a first value, the high-frequency amplifier stage is in the operation state, the first and second diodes are in the ON state, and the third diode is in the OFF state, so that a high-frequency signal is transferred through the first high-frequency-signal path, and when the switching voltage of the switching-voltage supply section has a second value, the high-frequency amplifier stage is in the non-operation state, the first and second diodes are in the OFF state, and the third diode is in the ON state, so that a high-frequency signal is transferred through the second high-frequency-signal path.

2. A high-frequency-signal switching circuit according to claim 1, wherein the high-frequency amplifier stage comprises an amplifier that includes a field-effect transistor and the switching voltage is applied to a gate of the field-effect transistor to switch the high-frequency amplifier stage between the operation state and the non-operation state.

3. A high-frequency-signal switching circuit according to claim 1, wherein the high-frequency amplifier stage has a high input impedance and a low output impedance.

4. A high-frequency-signal switching circuit according to claim 1, wherein an anode of each of the first and second diodes is connected to the switching-voltage supply section through a first resistor, and a cathode thereof is connected to a reference potential point through a second resistor.

5. A high-frequency-signal switching circuit according to claim 4, wherein a resistance of each of the first and second resistors is specified such that, when the switching voltage has the first value, a cathode voltage of the first diode is lower than that of the second diode, and when the switching voltage has the second value, the cathode voltage of the first diode is higher than that of the second diode.

6. A high-frequency-signal switching circuit according to claim 1, wherein the switching-voltage supply section comprises a band decoder, and selectively outputs a first-value switching voltage equal to a power-supply voltage and a second-value switching voltage equal to a reference potential.

7. A high-frequency-signal switching circuit according to claim 1, wherein the second high-frequency-signal path consists of the third diode.

8. A high-frequency-signal switching circuit according to claim 7, wherein the high-frequency amplifier stage comprises an amplifier that includes a field-effect transistor and the switching voltage is applied to a gate of the field-effect transistor to switch the high-frequency amplifier stage between the operation state and the non-operation state.

9. A high-frequency-signal switching circuit according to claim 7, wherein an anode of each of the first and second diodes is connected to the switching-voltage supply section through a first resistor, and a cathode thereof is connected to a reference potential point through a second resistor.

10. A high-frequency-signal switching circuit according to claim 9, wherein a resistance of each of the first and second resistors is such that when the switching voltage has the first value a cathode voltage of the first diode is lower than that of the second diode and when the switching voltage has the second value the cathode voltage of the first diode is higher than that of the second diode.

11. A high-frequency-signal switching circuit according to claim 7, wherein the switching-voltage supply section comprises a band decoder, and selectively outputs a first-value switching voltage equal to a power-supply voltage and a second-value switching voltage equal to a reference potential.

12. A high-frequency-signal switching circuit according to claim 1, wherein reverse bias voltages applied across the first and second diodes are large enough such that when the third diode is in the ON state and the first and second diodes are in the OFF state, the high-frequency signal is transferred substantially through only the second high-frequency-signal path, and a reverse bias voltage applied across the third diode is large enough such that when the first and second diodes are in the ON state and the third diode is in the OFF state, the high-frequency signal is transferred substantially through only the first high-frequency-signal path.

13. A high-frequency-signal switching circuit according to claim 12, wherein the reverse bias voltages are not less than about 0.9 volts.

14. A high-frequency-signal switching circuit according to claim 7, wherein reverse bias voltages applied across the first and second diodes are large enough such that when the third diode is in the ON state and the first and second diodes are in the OFF state, the high-frequency signal is transferred substantially through only the second high-frequency-signal path, and a reverse bias voltage applied across the third diode is large enough such that when the first and second diodes are in the ON state and the third diode is in the OFF state, the high-frequency signal is transferred substantially through only the first high-frequency-signal path.

15. A high-frequency-signal switching circuit comprising:
a first high-frequency-signal path including:
a first switch;
a second switch;
a high-frequency amplifier stage connected between the first and second switches; and
a second high-frequency-signal path including a third switch connected in parallel with the first and second switches and the high-frequency amplifier stage; and
a switching-voltage supply section to switch the high-frequency amplifier stage between an operation state and an non-operation state, and to switch the first, second and third switches between an ON state and an OFF state,
wherein, when a switching voltage of the switching-voltage supply section has a first value, the high-frequency amplifier stage is in the operation state, the first and second switches are in the ON state, and the third switch is in the OFF state, so that a high-frequency signal is transferred through the first high-frequency-signal path, and when the switching voltage of the switching-voltage supply section has a second value, the high-frequency amplifier stage is in the non-operation state, the first and second switches are in the OFF state, and the third switch is in the ON state, so that a high-frequency signal is transferred through the second high-frequency-signal path.

16. A high-frequency-signal switching circuit according to claim 15, wherein the high-frequency amplifier stage comprises an amplifier and the switching voltage is applied to a terminal of the amplifier to switch the high-frequency amplifier stage between the operation state and the non-operation state.

17. A high-frequency-signal switching circuit according to claim 15, wherein the high-frequency amplifier stage has a high input impedance and a low output impedance.

18. A high-frequency-signal switching circuit according to claim 15, wherein a first terminal of each of the first and second switches is connected to the switching-voltage supply section through a first resistor, and a second terminal thereof is connected to a reference potential through a second resistor.

19. A high-frequency-signal switching circuit according to claim 15, wherein a resistance of each of the first and second resistors is specified such that, when the switching voltage has the first value, a voltage applied to the second terminal of the first switch is lower than that of the second switch, and when the switching voltage has the second value, the voltage applied to the second terminal of the first switch is higher than that of the second switch.

20. A high-frequency-signal switching circuit according to claim 15, wherein the switching-voltage supply section comprises a band decoder, and selectively outputs a first-value switching voltage equal to a power-supply voltage and a second-value switching voltage equal to a reference potential.

21. A high-frequency-signal switching circuit according to claim 15, wherein reverse bias voltages applied across the first and second diodes are large enough such that when the third diode is in the ON state and the first and second diodes are in the OFF state, the high-frequency signal is transferred substantially through only the second high-frequency-signal path, and a reverse bias voltage applied across the third diode is large enough such that when the first and second diodes are in the ON state and the third diode is in the OFF state, the high-frequency signal is transferred substantially through only the first high-frequency-signal path.

22. A high-frequency-signal switching circuit according to claim 15, wherein the second high-frequency-signal path consists of the third switch.

23. A high-frequency-signal switching circuit according to claim 22, wherein the high-frequency amplifier stage comprises an amplifier and the switching voltage is applied to a terminal of the amplifier to switch the high-frequency amplifier stage between the operation state and the non-operation state.

24. A high-frequency-signal switching circuit according to claim 22, wherein a first terminal of each of the first and second switches is connected to the switching-voltage supply section through a first resistor, and a second terminal thereof is connected to a reference potential point through a second resistor.

25. A high-frequency-signal switching circuit according to claim 24, wherein a resistance of each of the first and second resistors is such that when the switching voltage has the first value a voltage applied to the second terminal of the first switch is lower than that of the second switch and when the switching voltage has the second value the voltage applied to the second terminal of the first switch is higher than that of the second switch.

26. A high-frequency-signal switching circuit according to claim 22, wherein the switching-voltage supply section comprises a band decoder, and selectively outputs a first-value switching voltage equal to a power-supply voltage and a second-value switching voltage equal to a reference potential.

27. A high-frequency-signal switching circuit according to claim 22, wherein reverse bias voltages applied across the first and second diodes are large enough such that when the third diode is in the ON state and the first and second diodes are in the OFF state, the high-frequency signal is transferred substantially through only the second high-frequency-signal path, and a reverse bias voltage applied across the third diode is large enough such that when the first and second diodes are in the ON state and the third diode is in the OFF state, the high-frequency signal is transferred substantially through only the first high-frequency-signal path.

28. A method decreasing distortion in high-frequency-signal switching circuit, the method comprising:
   forming a first high-frequency-signal path that includes a first diode, a second diode, and a high-frequency amplifier stage connected in series between the first and second diodes;
   forming a second high-frequency-signal path that consists of a second diode connected in parallel between the first and second diodes and the frequency amplifier stage;
   switching the high-frequency amplifier stage between an operation state and an non-operation state, and the first, second and third diodes between an ON state and an OFF state; and
   transferring a high-frequency signal through the first high-frequency-signal path when the high-frequency amplifier stage is in the operation state, the first and second diodes are in the ON state, and the third diode is in the OFF state, and transferring the high-frequency signal through the second high-frequency-signal path when the high-frequency amplifier stage is in the non-operation state, the first and second diodes are in the OFF state, and the third diode is in the ON state.

29. The method of claim 28, further comprising limiting a voltage applied to a cathode of the first diode to less than that of the second diode when the high-frequency amplifier stage is in the operation state, the first and second diodes are in the ON state, and the third diode is in the OFF state, and limiting the voltage applied to the cathode of the second diode to less than that of the first diode when the high-frequency amplifier stage is in the non-operation state, the first and second diodes are in the OFF state, and the third diode is in the ON state.

30. The method of claim 29, further comprising determining resistances to be connected to an anode of each of the first and second diodes to limit the voltages applied to the cathodes and connecting the resistances to the anodes of the first and second diodes.

31. The method of claim 28, further comprising selectively outputting a first-value switching voltage equal to a power-supply voltage and a second-value switching voltage equal to a reference potential when switching the high-frequency amplifier stage between the operation state and the non-operation state, and the first, second and third diodes between the ON state and the OFF state.

32. The method of claim 28, further comprising reverse biasing the first and second diodes such that when the third diode is in the ON state and the first and second diodes are in the OFF state, the high-frequency signal is transferred substantially through only the second high-frequency-signal path, and reverse biasing the third diode such that when the first and second diodes are in the ON state and the third diode is in the OFF state, the high-frequency signal is transferred substantially through only the first high-frequency-signal path.

* * * * *